United States Patent
Gupta et al.

(10) Patent No.: US 8,314,633 B2
(45) Date of Patent: Nov. 20, 2012

(54) REDUCING SWITCHING NOISE

(75) Inventors: Nitin Gupta, Noida (IN); Tapas Nandy, Delhi (IN); Phalguni Bala, West Bengal (IN); Pikul Sarkar, West Bengal (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 393 days.

(21) Appl. No.: 12/650,092

(22) Filed: Dec. 30, 2009

(65) Prior Publication Data

US 2011/0062983 A1    Mar. 17, 2011

(30) Foreign Application Priority Data

Sep. 11, 2009  (IN) .......................... 1885/DEL/2009

(51) Int. Cl.
*H03K 19/003* (2006.01)
*H03K 19/0175* (2006.01)

(52) U.S. Cl. .............. 326/28; 326/26; 326/82; 327/264; 327/266

(58) Field of Classification Search .............. 326/26–28, 326/82, 86; 327/264, 108, 266
See application file for complete search history.

(56) References Cited

U.S. PATENT DOCUMENTS

| | | | | |
|---|---|---|---|---|
| 5,986,463 | A * | 11/1999 | Takiguchi | 326/27 |
| 7,786,751 | B2 * | 8/2010 | Chujo et al. | 326/27 |
| 2005/0068065 | A1 * | 3/2005 | Wijeratne | 326/98 |

OTHER PUBLICATIONS

Hough et al., "New Approaches for On-Chip Power Switching Noise Reduction," Custom Integrated Circuits Conference, 1995.
Larsson, "Resonance and Damping in CMOS Ciruits with On-Chip Decoupling Capacitance," IEEE Transactions on Circuits and Systems—1: Fundamental Theory and Applications, vol. 45, No. 8, pp. 849-858, Aug. 1998.

* cited by examiner

*Primary Examiner* — Daniel D Chang
(74) *Attorney, Agent, or Firm* — Wolf, Greenfield & Sacks, P.C.

(57) ABSTRACT

Described herein are various principles for operating a transmitter circuit to reduce noise affecting a signal being generated and reducing jitter. In some embodiments, a circuit is operated in a way that switching occurs at or above a bit rate of transmission, such that at least one switch changes state at least for every bit. Operating the circuit in such a way leads to a switching rate that is above a resonant frequency of the circuit and prevents large oscillations and noise from being inserted into the signal and causing communication problems.

23 Claims, 7 Drawing Sheets

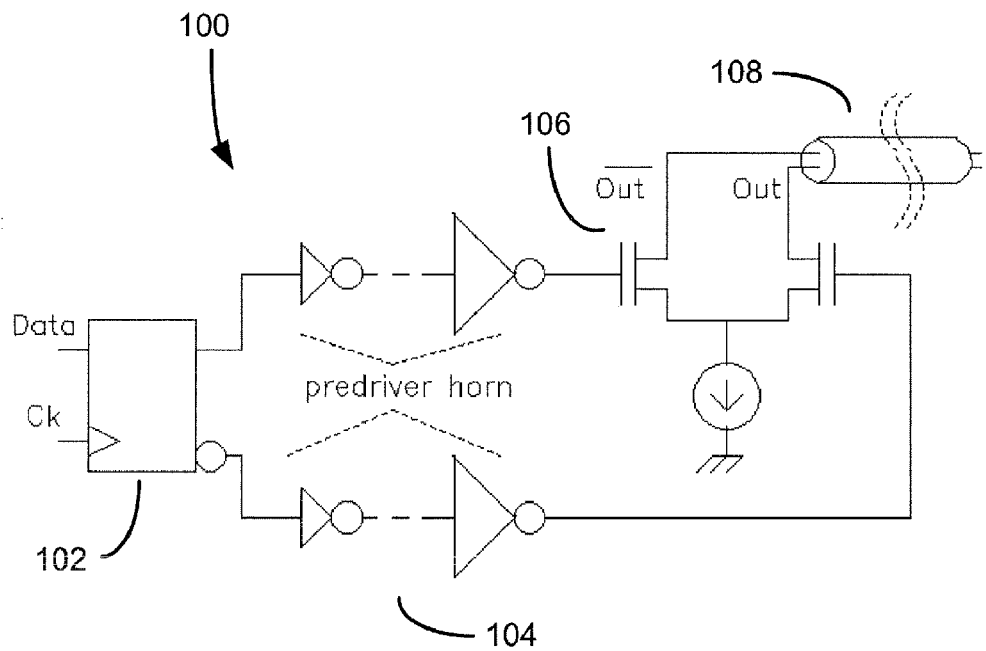
FIG. 1
Prior Art
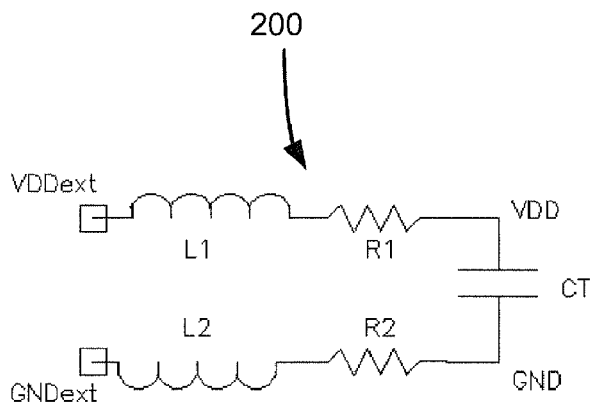
$$\omega_R = \sqrt{\frac{1}{L_T C_T}}; \qquad \zeta = \frac{R_T}{2}\sqrt{\frac{C_T}{L_T}};$$
Where, $L_T = L1 + L2; \quad R_T = R1 + R2;$
(a)
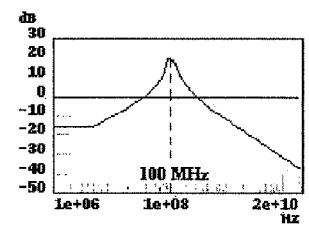
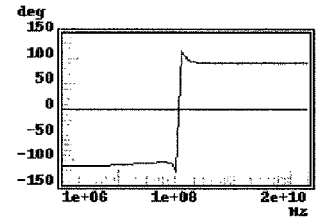
(b)
Prior Art FIG. 2

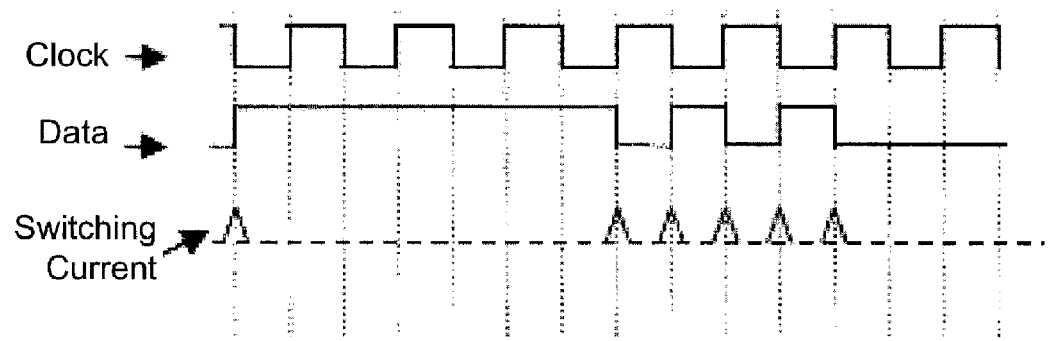
FIG. 3
Prior Art
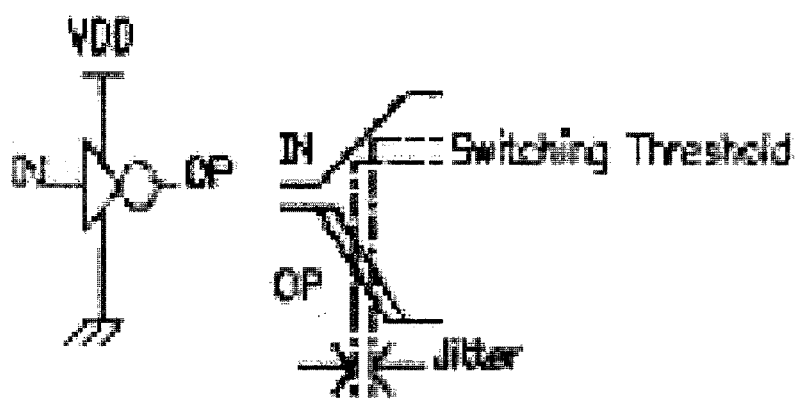
Prior Art FIG. 4

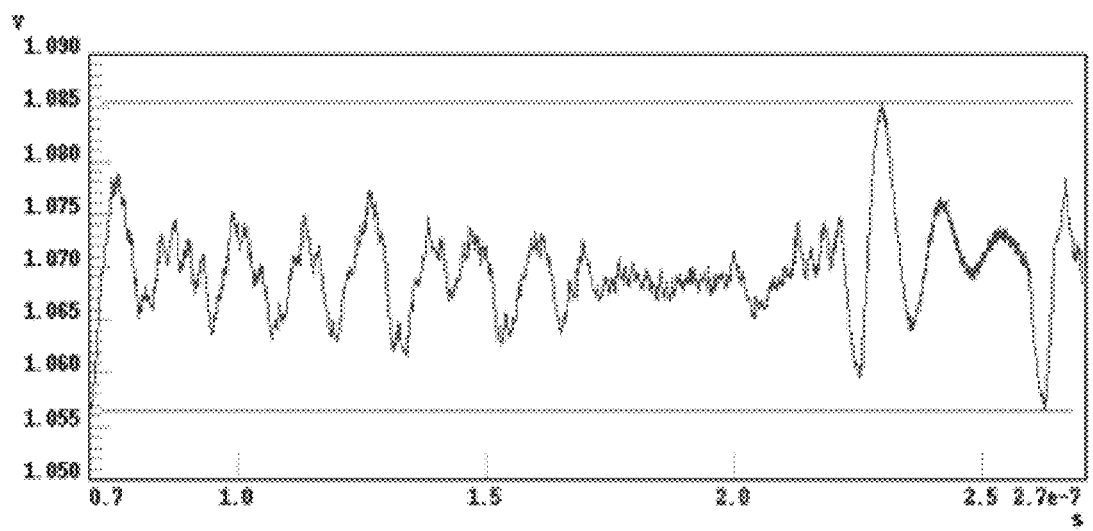
900
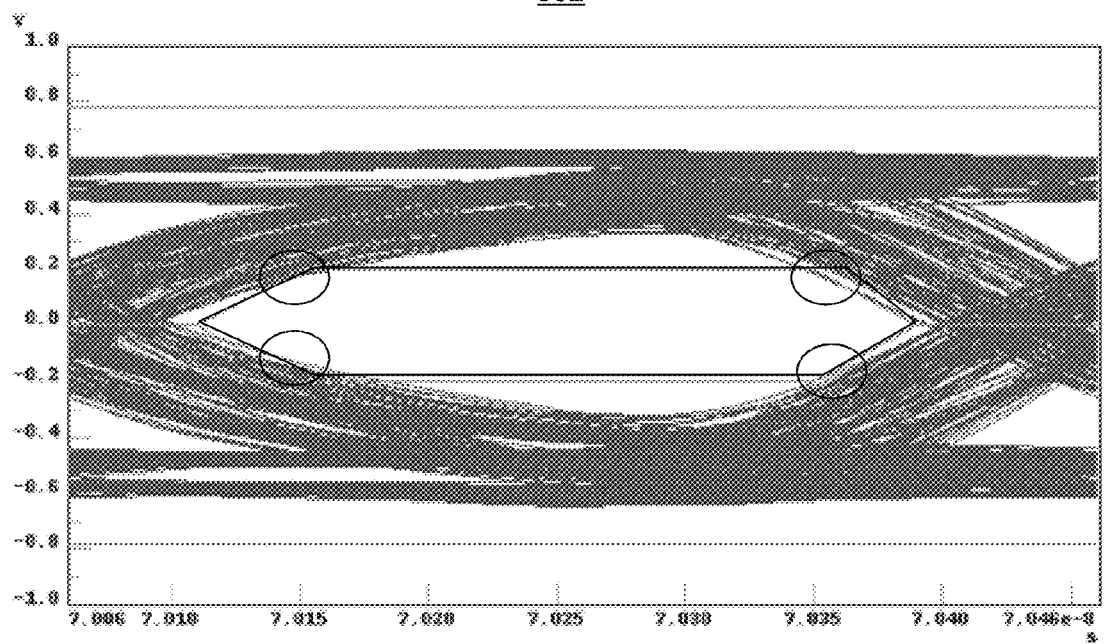
902
FIG. 9A

904
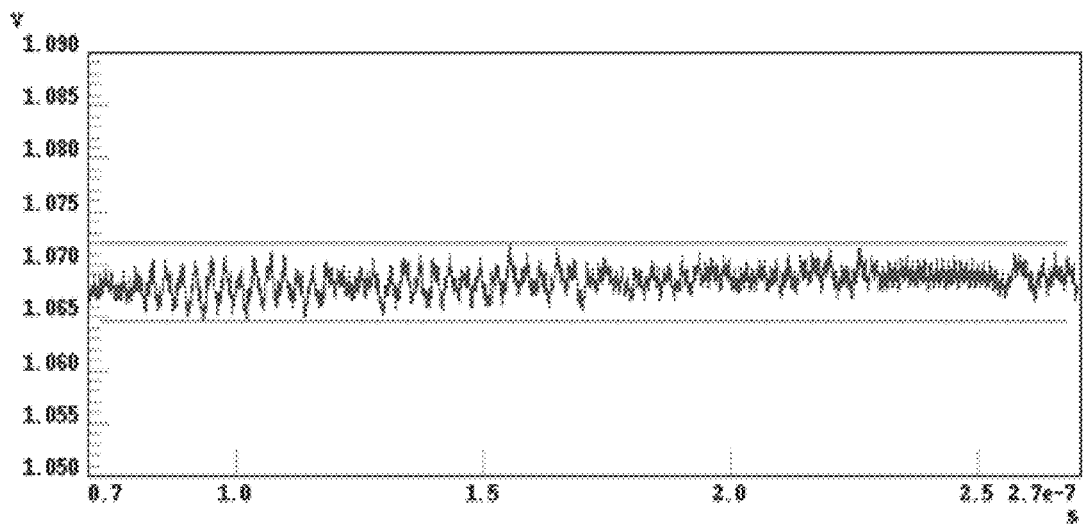
906
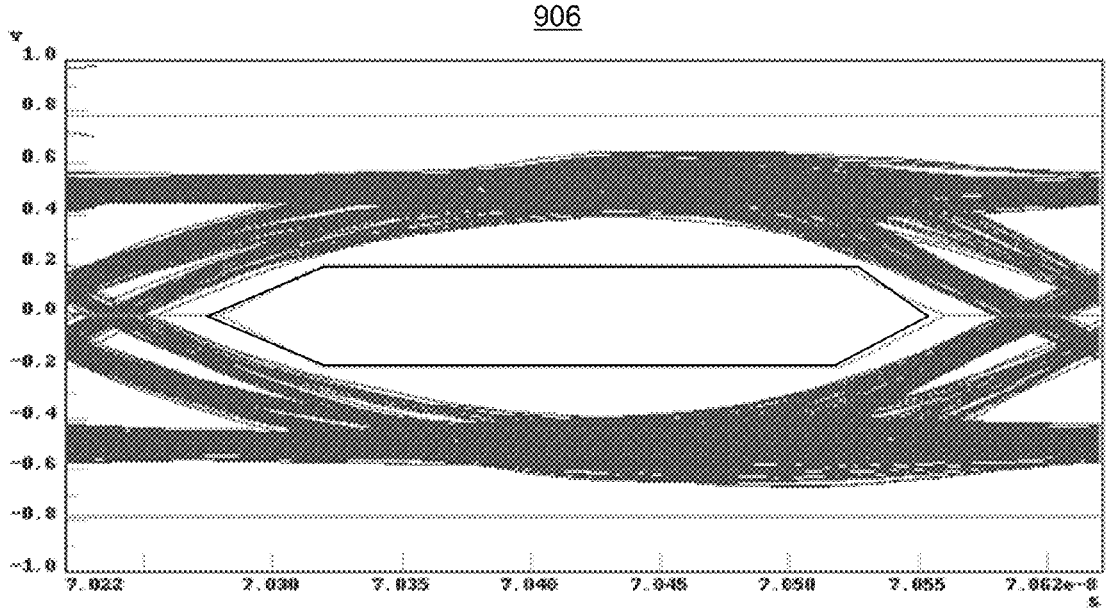
FIG. 9B

REDUCING SWITCHING NOISE

RELATED APPLICATIONS

This application claims the priority benefit of Indian provisional patent application number 1885/De1/2009, filed on Sep. 11, 2009, entitled "Reduction of Self-Induced Supply Noise," which is hereby incorporated by reference to the maximum extent allowable by law.

BACKGROUND

1. Field of Invention

Embodiments of the present invention relate to techniques for reducing switching noise affecting a signal. More particularly, some embodiments relate to techniques for reducing noise inserted into a signal by switching circuits in a transmitter driver when a signal is being generated for transmission in a transmission medium. More particularly, some embodiments relate to techniques for operating two parallel switching circuits in a predriver of a transmitter to increase a switching rate for the transmitter and avoid switching at a resonant frequency of the transmitter.

2. Discussion of Related Art

Transmitters that communicate a data signal to a receiver in a transmission medium (e.g., a wire) include various electric circuits to generate the signal. Among the circuits are drivers that each receive an input signal and, using switches, create an output signal that is an amplified version of the input signal. Multiple drivers can be chained together to amplify a signal to a level that it can be transmitted with a desired power to travel a desired distance. A last driver in a chain that outputs the signal from the transmitter (e.g., onto the transmission medium) is termed the output driver, while any drivers preceding the output driver in the chain are termed predrivers.

FIG. 1 shows a transmitter 100 that includes a circuit 102 that is outputting data to a chain of predrivers (also called a predriver horn) 104 that are each switching and amplifying the data signal. The last predriver of the chain 104 in turn provides the amplified data signal to an output driver 106 that generates a signal in a transmission medium 108. Circuit 100 creates two similar signals in the transmission medium 108, a positive and a negative, logically inverted version of the data signal, and thus its data path includes a chain of predrivers for the positive signal and a chain of predrivers for the negative signal and an output driver 106 that has two switches and two outputs.

Each of the drivers includes switches that operate in response to the input data signal. When a signal is switched, oscillations are inserted into the signal that create noise in the supply that degrades the signal. Typically, the oscillations/noise affect a signal for a small period of time before "settling." Accordingly, the oscillations are typically eliminated before more oscillations are inserted by the next switch of the switches. However, this settling time is impacted by a rate at which the oscillations are being created in the signal, which in the case of a chain of predrivers is the rate at which to the switches are switching. At a particular rate, known as the "resonant frequency," this settling time will be large, such that some oscillations may exist in the signal at the time more oscillations are created. This can lead to large oscillations and changes in phase that can lead to jitter in the signal communicated in the transmission medium. This jitter can cause data errors at the receiver and interfere with communication.

FIG. 2 illustrates in part (a) the package parasitics of FIG. 1's R-L-C model, showing lumped components on supply and ground, and how this reduced form can be used to determine the resonant frequency $\omega_R$ and damping factor $\zeta$ of the circuit 100 (the damping factor affecting the length of the settling time). FIG. 2 illustrates in part (b) the magnitude and phase of the impedance of the circuit 100 at various frequencies, including the resonant frequency (100 MHz) that creates the most jitter in the signal.

Switches in the predrivers change state each time a bit of the input data signal changes. A 0 bit followed by a 0 bit does not cause a switch, while a 0 bit followed by a 1 bit does cause a switch. FIG. 3 shows such a case, showing that as the data signal Data does not change between cycles of the Clock, the switches do not change state and there is no Switching Current, but if Data does change there is a corresponding Switching Current. As data is being input to the chain of predrivers, a particular sequence of bits may cause the switches of the predrivers to switch at a rate that matches the resonant frequency of the chain of predrivers and causes the oscillations that lead to jitter in the signal.

FIG. 4 shows a graph of this potential jitter for one predriver. For an input signal IN the predriver may generate a range of output signals OP, rather than a single clean signal. Some of these output signals in the range may cause errors at the receiver.

Some techniques have been proposed for avoiding errors that result from jitter. Some of these techniques change the chain of predrivers in a way that changes the resonant frequency to avoid the resonant frequency from being reached. For example, some techniques propose additional decoupling capacitors for the predriver circuit that would counteract the natural inductances of the circuit and lower the resonant frequency to a level that would be below switching frequencies. Other techniques change the circuit in a way that reduces settling time at the resonant frequency in an attempt to avoid the jitter from occurring even at the resonant frequency. For example, some techniques add small resistances that would increase the damping factor and thus decrease the settling to time. These resistances include a DC resistance that shorts to ground to draw some energy away from the oscillating signal path.

One other technique for avoiding jitter includes adding a "shadow" switching circuit to the transmitter. The shadow switching circuit does not contribute to generating a signal in the transmission medium, but rather only acts to affect the chain of predrivers in a way that avoids the resonant frequency of the chain of predrivers from being reached. As discussed above, the resonant frequency may be reached by switches of the predrivers switching and not switching according to a particular bit sequence. The shadow switching circuit in these techniques switches a signal each time a predriver does not switch the signal. In this way, a switch is performed on each clock cycle, rather than dependent on the value of the bits. This maintains the rate of switching as a constant switching on each clock cycle, such that the switching rate does not vary and does not reach the resonant frequency. In these circuits, the clock rate is above the resonant frequency of the chain of predrivers, so switching on each clock cycle causes the switching rate to be above the resonant frequency. In this way, even though the chain of predrivers may be switching according to the resonant frequency, the entire circuit (the chain of predrivers and the shadow circuit) is switching at a frequency well above the resonant frequency.

SUMMARY

In one embodiment, there is provided a circuit to generate a signal. The circuit comprises an input to receive data. The data comprising a sequence of bits. The circuit further comprises a first data path coupled to the input, where the first data path comprises at least one first driver operating at a first switching frequency to generate a first signal from a first portion of the sequence of bits. The circuit also comprises a second data path coupled to the input, where the second data path comprises at least one second driver operating at a second switching frequency to generate a second signal from a second portion of the sequence of bits.

In another embodiment, there is provided a method of operating a circuit to generate a signal. The circuit includes at least a first data path and a second data path, and each of the first data path and the second data path include at least one driver that switches to generate signals to be used in generating the signal. The method comprises allocating each bit of a sequence of bits to one of at least two subsets of bits, where the at to least two subsets of bits are non-overlapping subsets, and generating the signal. Generating the signal comprises passing a first subset of bits through the first data path, passing a second subset of bits through the second data path, and operating the at least one driver of the first data path and the second data path such that an overall switching frequency of both the first data path and the second data path is at or above a bit rate of the circuit.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 is a diagram of a conventional transmitter having one data path that includes two chains of predrivers;

FIG. 2 is the package parasitics of FIG. 1's R-L-C model, showing lumped components on supply and ground, and graphs of the impedance and phase of the impedance of the equivalent circuit at a range of frequencies;

FIG. 3 is a timing diagram showing operations of the conventional circuit of FIG. 1;

FIG. 4 is a diagram of inputs and outputs of a driver of the conventional circuit of FIG. 1;

FIG. 9A is a supply noise and an eye diagram for a conventional transmitter and FIG. 9B is a supply noise and an eye diagram for a transmitter operating in accordance with techniques described herein.

DETAILED DESCRIPTION

Figure 5:
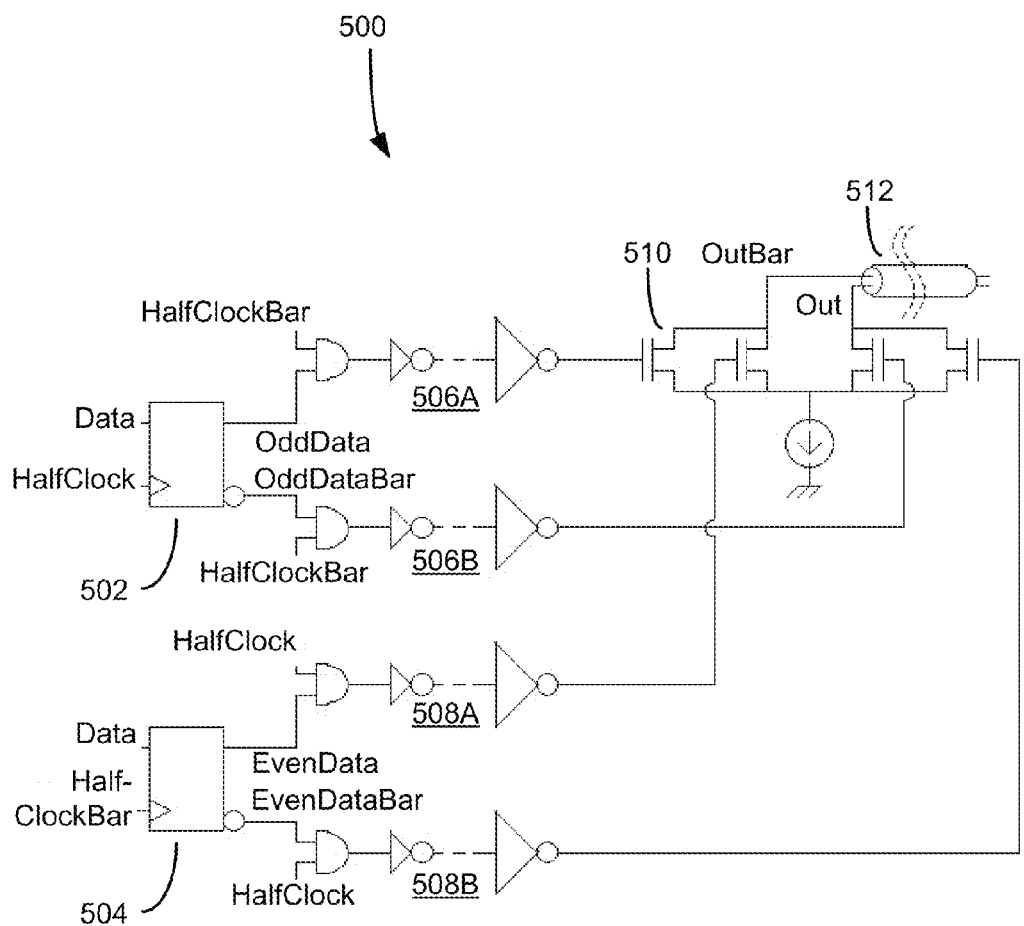
FIG. 5 is a diagram of a transmitter operating in accordance with some techniques described herein and having two data paths each having predrivers.

As discussed above, techniques have been developed for adjusting transmitter circuits to prevent a switching rate from reaching a resonant frequency of the circuit and for lowering a settling time of the circuits.

Though, Applicants have appreciated that each of these techniques yields a solution that is not reusable between transmitter circuits. Each time a new circuit is designed and produced, the techniques must be completely repeated for the new circuit. For example, using techniques that insert decoupling capacitors, each time a new circuit is created, the circuit must be analyzed in full to determine the proper number, size, and placement of decoupling capacitors. As another example, when a shadow switching circuit is to be used for a chain of predrivers, the shadow switching circuit must be redesigned each time to be properly balanced with the chain of predrivers and connected with and located near the chain of predrivers in a way that it will have the proper impact on the chain of predrivers. Redesigning in this way increases the time and cost of development of new circuits.

Applicants have also appreciated that these techniques often lead to wastage of resources in the circuits that do not contribute to generating the signal. For example, the decoupling capacitors or shadow switching circuit could take up a great deal of space in a circuit without contributing to the generation of the signal, and extra resistances and DC current through a resistor short to ground waste energy of the circuit that could be used for driving the signal.

Described herein are various principles for operating a circuit generating a signal for transmission to reduce noise affecting the signal being generated for transmission and reducing jitter. In some embodiments, a circuit is operated in a way that switching occurs at or above a bit rate of transmission, such that at least one switch changes state at least for every bit. Operating the circuit in such a way leads to a switching rate that is above a resonant frequency of the circuit and prevents large oscillations and noise from being inserted into the signal and causing communication problems.

In one embodiment, a circuit includes an even driver and an odd driver. Each of the even and odd drivers may include one or more drivers in a chain. Each of the even and odd drivers may be connected to a control circuit outputting data for transmission. Bits to be transmitted are divided between the even and odd driver, such that the odd to driver receives every other bit starting with the first bit (bits 1, 3, 5, 7, etc. in a sequence of bits) and the even driver receives every other bit starting with the second bit (bits 2, 4, 6, 8, etc. in a sequence of bits). Each of the drivers is arranged such that it is turned off when it is not driving a bit. For example, the odd driver and the even driver could each be gated with a logic gate operating according to a clock signal. Each time the clock signal goes high, the gate allows the data signal through to the predriver and the predriver switches according to the value of the data signal (i.e., the value of the bit). In this way, each driver switches each time it receives and drives a bit. As each driver is receiving and driving every other bit, the transmitting circuit as a whole switches for every bit that is received and driven. The switch rate of the transmitting circuit is therefore approximately constant at the bit rate and is above the resonant frequency of the circuit. This prevents extreme oscillations and prevents jitter on the output that would cause errors at a receiver of the signal.

FIG. 5 shows an example of one transmitter circuit 500 that operates in accordance with some techniques described herein. The transmitter 500 generates a signal and transmits that signal over the transmission medium 512. Transmitter 500 generates a positive and a negative version of the signal that is transmitted, so each of the drivers includes both a positive and a negative driver.

In the example of FIG. 5, a negative, logically inverted version of a signal is labeled with a "Bar" or a line over the top of the label. For example, CkHalf is a positive version of a reduced-rate (half-rate) clock signal and CkHalfBar is the reflected, negative version of the reduced-rate clock signal.

Figure 6:
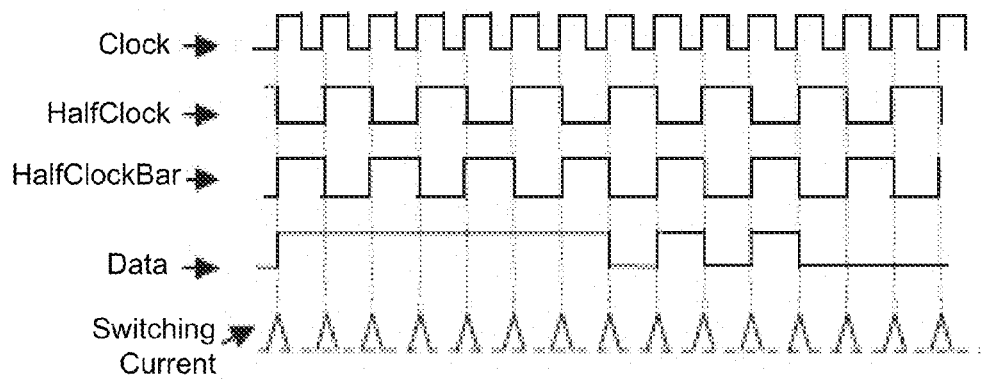
FIG. 6 is a timing diagram showing operations of the transmitter of FIG. 5.

The circuit 500 of FIG. 5 shows two data paths for the transmitter: an even data path and an odd data path. The odd data path of circuit 500 includes a memory element 502 (e.g., a flip flop or latch) that accepts bits on the Data input to be transmitted and receives a clock signal HalfClock. As shown in FIG. 6, the circuit 500 operates with a clock signal Clock that is reduced to a half-rate signal HalfClock and to HalfClockBar that is a reflected, inverted form of HalfClock. HalfClock is therefore at a high value every other time Clock is at a high value. The bits may be being transmitted to the memory element 502 at the clock rate, but the HalfClock causes the memory element to only accept every other bit (i.e., half the bits). In this way, the memory element 502 only receives the odd-numbered bits: bit 1, bit 3, bits 5, bit 7, etc.

The memory element 502 produces two outputs based on input bits in the form of a positive OddData signal and a negative OddDataBar signal. The positive OddData signal matches the data bit input on the Data line (e.g., 0 when the bit was a 0) and the OddDataBar is an inverse of the data bit input on the Data line (e.g., 0 when the bit was a 1). The positive OddData signal is provided to the circuit 506A including a logic gate and one or more drivers and the negative OddDataBar signal is provided to the circuit 506B including a logic gate and one or more drivers.

The logic gates of circuits 506A and 506B—implemented here as AND gates—are operated with the opposite clock signal HalfClockBar. Accordingly, the logic gates permit a signal to be transmitted when HalfClockBar is at a high value. This allows for one cycle of Clock for the memory element to receive and output a data bit (based on HalfClock) while on the next cycle of Clock (based on HalfClockBar) the data bit is being driven through the data path. When the logic gate permits a signal to flow, the signal is provided to the one or more drivers of the circuits 506A and 506B.

In some, but not all, cases the driver(s) may act to amplify the signal. Additionally, each of the one or more drivers may operate to switch the signal line. This switching is performed for a high value signal. For OddData, this corresponds to a data bit of 1, and for OddDataBar, this corresponds to a data bit of 0.

As discussed above, in a conventional transmitter, if a value of a data bit did not change between cycles of the clock (e.g., a 0 followed by another 0), then a switch would not change state. This led to a reduction in the switching frequency. In the circuits 506A and 506B of FIG. 5, though, the logic gate that is operating according to HalfClockBar signal shuts off the signal line when the HalfClockBar signal goes low. This means that when signals carrying a data bit do flow through the circuits 506A and 506B, there will be no previous value of the data bit and the switch will change state. Accordingly, when the positive OddData signal and negative OddDataBar signal flow through the circuits 506A and 506B, respectively, when HalfClockBar is high, the switches of one of the circuits will change state. In other words, one of circuits 506A and 506B will be switching at half of the cycles of the Clock.

The circuits 506A and 506B then provide an output signal as OddData and OddDataBar to an output driver 510, which is discussed further below.

The even data path operates similarly to the odd data path. The even data path includes a memory element 504 that accepts bits on the Data input to be transmitted and receives a clock signal HalfClock. As shown in FIG. 6, similar to the HalfClock signal, to HalfClockBar is a half-rate form of the clock signal Clock. HalfClockBar is therefore at a high value every other time Clock is at a high value, and is oppositely phased with HalfClock such that it is high when HalfClock is low and vice versa. The bits may be being transmitted to the memory element 504 at the clock rate, but the HalfClockBar causes the memory element to only accept every other bit (i.e., half the bits). In this way, the memory element 504 only receives the even-numbered bits: bit 2, bit 4, bits 6, bit 8, etc.

The memory element 504 also produces two outputs EvenData and EvenDataBar and provides those signals to two circuits 508A and 508B, just as with the odd data path discussed above. Though, while the circuits 506A and 506B of the odd data path had logic gates operating according to the HalfClockBar signal, the logic gates of the circuits 508A and 508B of the even data path operate according to the HalfClock signal. Accordingly, the switches of the driver(s) of one of the circuits 508A and 508B change state when the HalfClock signal is high. In other words, one of the circuits 508A and 508B will be switching at half of the cycles of the Clock. As discussed above with regard to the odd data path, the logic gates of the circuits 508A and 508B cause at least some of the switches to change state for each bit of the EvenData and EvenDataBar signals.

The signals output from the circuits 506A, 506B, 508A, and 508B are then provided as input to the output driver 510. The output driver 510 includes four switches each receiving one of the outputs OddData, EvenData, OddDataBar, and EvenDataBar. The output driver 510 also includes a current source connected to ground. The value of each of the signals affects the state of the switch to which a signal is connected, which adjusts the value of the output signals Out and OutBar that are generated by the output driver 510 and applied to the transmission medium 512 for transmission to a receiver.

Looking at the circuit as a whole, at least some switches of the odd data path will switch according to the HalfClockBar signal, on half of the cycles of the Clock, and at least some switches of the even data path will switch according to the HalfClock signal, on the other half of the cycles of the Clock. In this way, as shown in FIG. 6, there is a switch (and Switching Current) at every cycle of the Clock signal, which matches the bit rate of the transmitter 500. The graph of the Switching Current shown in FIG. 5 can be compared to the graph of the Switching Current for a conventional transmitter shown in FIG. 3 to see the difference in the rate of switching for the same data.

Because the transmitter 500 of FIG. 5 has an approximately constant switching rate that is above the resonant frequency of the circuit, the switching rate will not equal or near the resonant frequency of the circuit and the oscillations and jitter accompanying the resonant frequency will not affect the signal.

Figure 7A:
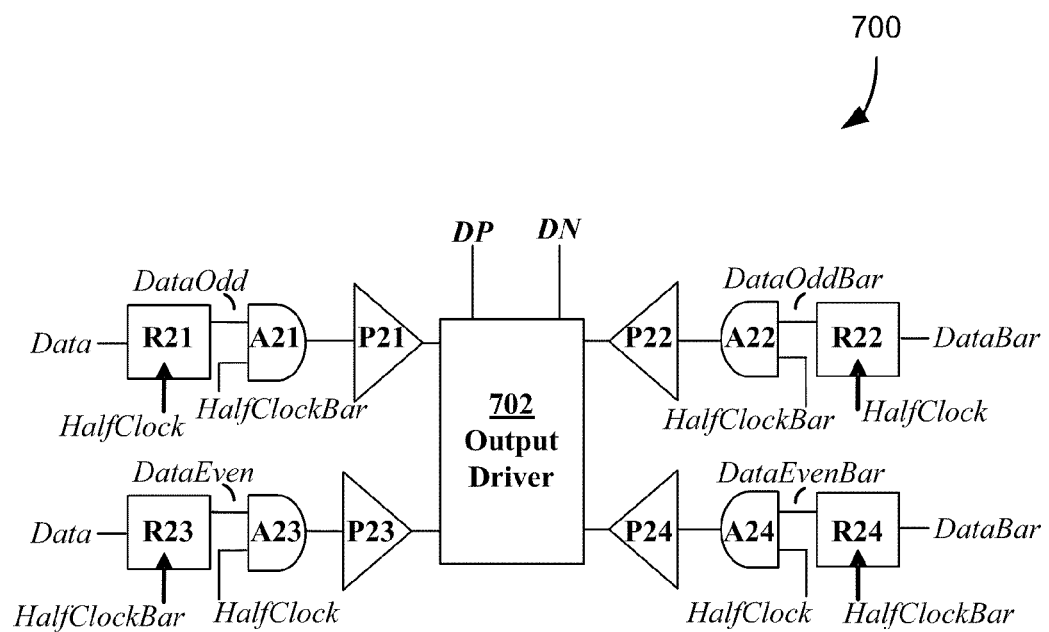
FIGS. 7A and 7B are a different representation of the transmitter of FIG. 5.
Figure 7B:
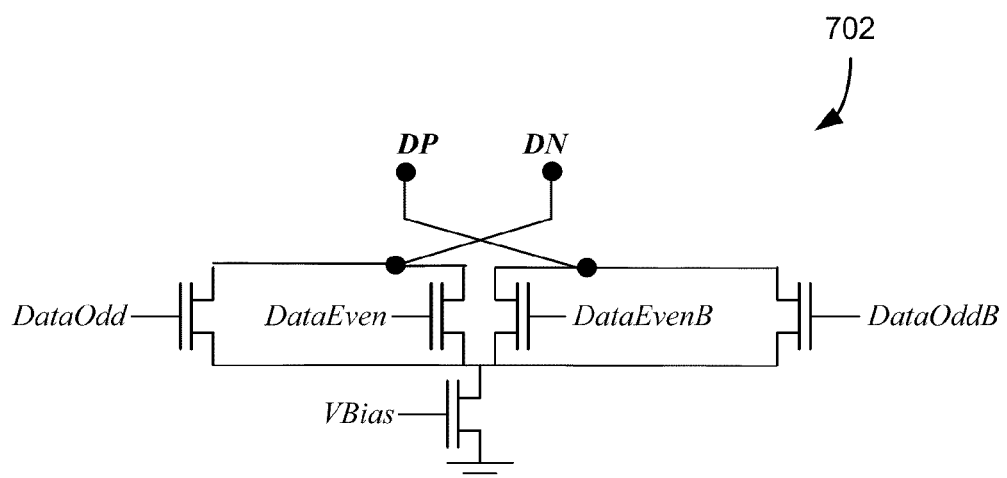

Circuit 500 of FIG. 5 is shown in a different, but equivalent, form in FIGS. 7A and 7B. The odd data path is shown as a DataOdd path including a memory element R21 accepting an input Data signal, a logic gate A21, and a driver P21 and a DataOddBar path including a memory element R22 accepting an input DataBar signal, a logic gate A22, and a driver P22. The even data path is shown as an EvenData path including a memory element R23 accepting an input Data signal, a logic gate A23, and a driver P2 and a memory element R24 accepting an input DataBar, a logic gate A24, and a driver P24. Each of these paths provides an input to an output driver 702, which is illustrated in detail in FIG. 7B as including four switches and a current source. The current source of the output driver 702 is implemented in this embodiment as a transistor accepting a bias voltage $V_{bias}$. The output driver also produces two output signals DP and DN that correspond to Out and OutBar.

It should be appreciated that the circuits 500 and 700 are merely illustrative of the ways in which embodiments may be implemented and may operate and that other circuits are possible. Embodiments are not limited to being implemented in the manner of either of the circuits 500 or 700.

For example, while only two data paths—an even data path and an odd data path—are implemented in the circuits 500 and 700, any suitable number of data paths may be used, including two, three, four, etc. These additional data paths may also operate according to any suitable reduced-rate clock signals, other than half-rate signals. Though, it will also be recognized that when additional data paths are implemented with more switches in the output driver, a parasitic capacitance of the output driver may rise. This higher parasitic capacitance may have some undesirable properties in some environments and applications, such as in high-speed transmitters. Though, additional data paths may, in some cases, be implemented without increasing the number of switches in the output driver.

Additionally, in the embodiments shown as circuits 500 and 700, the switching rate of the circuit was equal to the clock frequency and equal to the bit rate. Embodiments of the invention are not limited to operating with a switching rate equal to the clock frequency or equal to the bit rate. In some cases, the switching frequency may to be implemented as a frequency above the data rate, such as by operating the data paths multiple times per bit.

Further, where the output driver 510 is illustrated in FIG. 5 providing an output to a wired transmission medium, any suitable transmission medium or media may be used, including any suitable wired or wireless transmission medium. Additionally, while the output driver 510 is shown directly coupled to a transmission medium, in some cases the output driver 510 may not be directly coupled to a transmission medium or may be adapted to be coupled, directly or indirectly, to a transmission medium.

The circuit elements of circuit 500 of FIG. 5 may be implemented in any suitable manner, including according to designs that are known or will be known, as the invention is not limited to using any particular circuit elements. Accordingly, the memory elements, logic gates, drivers, and switches of circuit 500 are not limited to being implemented in any particular way. For example, the driver(s) used in the circuits may be any suitable drivers, including drivers that amplify signals and drivers that do not amplify signals. As another example, the logic gates used in the circuits may be any suitable logic gates, including logic gates other than AND gates.

Figure 8:
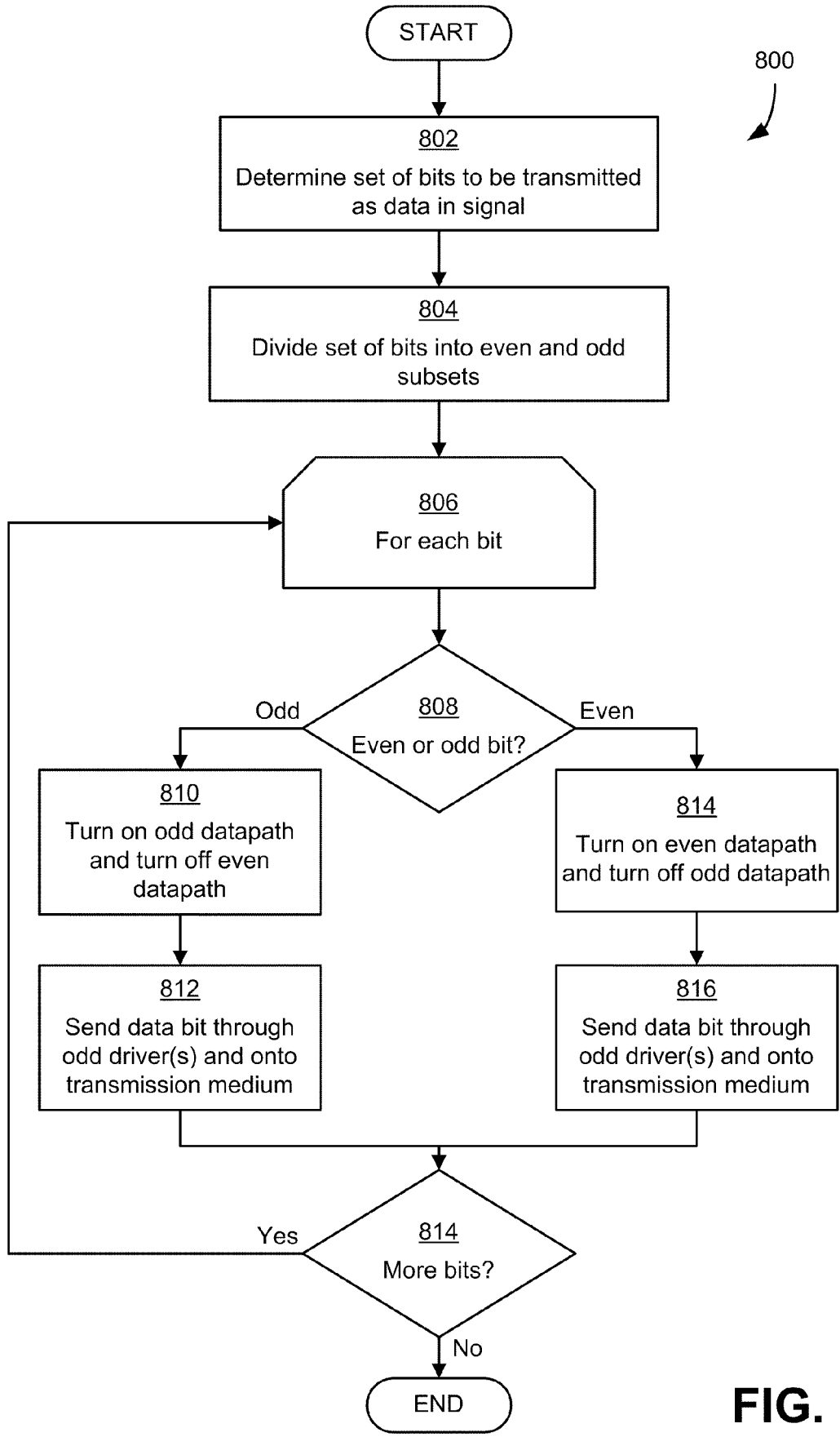
FIG. 8 is a flowchart of a method for operating a transmitter in accordance with techniques described herein.

FIG. 8 shows an example of one process for operating a transmitter in accordance with techniques described herein. Process 800 being in block 802, in which a set of bits to be transmitted as data in a signal is determined. In block 804, this set of bits is divided into at least two subsets, at least an even subset and an odd subset. The subsets may be divided in any suitable manner, including by assigning every other bit to the odd subset and the other bits to the even subset. In other cases, bits may be divided based on whether two bits following one another are different. If the bits are different, then may be assigned to a same subset, but when they are the same, the second bit may be assigned to a different subset. Further, in some cases, more than two subsets may be used. Any suitable division technique may be used in block 804.

In block 806, a loop is executed for each bit in the set of bits from block 802. In block 808, it is determined whether the bit is in the even subset or the odd subset. If it is determined that the bit is in the odd subset, then in block 510 the odd data path is turned on or activated and the even data path is turned off or deactivated. Turning on/off data paths may, in some cases, comprise operating a logic gate using a signal, though any suitable technique for turning data paths on/off may be used.

In block 812, after the odd data path is turned on and the even data path is turned to off, the data bit is sent through the odd data path and the driver(s) of the odd data path and onto a transmission medium or media.

If, however, it is determined in block 808 that the bit is in the even subset, then in block 814 the even data path is turned on and the odd data path is turned off. As in block 810, turning on/off the data paths may be done in any suitable manner. In block 816, after the even data path is turned on and the odd data path is turned off, the data bit is sent through the even data path and the driver(s) of the even data path and onto the transmission medium or media.

In block 814, it is determined whether there are more bits to be transmitted. If so, then the process continues in block 806 with the next bit. If not, then the process 800 ends.

It should be appreciated that the process 800 is merely illustrative of the types of processes that can be implemented in accordance with techniques described herein to operate a circuit to transmit data on a transmission medium. Embodiments are not limited to implementing the process 800, as others are possible.

FIGS. 9A and 9B show supply traces and eye diagrams to compare the transmission characteristics of a conventional transmitter as shown in FIG. 1 with the transmitter acting in accordance with techniques described herein. FIG. 9A shows in the graph 900 a supply trace showing a great deal of noise in the signal, including large oscillations, that results from a conventional transmitter. FIG. 9A also shows in the eye diagram 902 that the possible signals generated by the conventional transmitter vary wildly and that some of them, as shown by the circles on the eye diagram, fall within the masked area that indicates potential trouble being received properly by a receiver. In contrast, FIG. 9B shows in the graph 900 a supply trace from the transmitter acting in accordance with techniques described herein and having much less noise and much smaller oscillations. Further, as shown in the eye diagram 906, there is less variation in the signals that could be transmitted by the transmitter and none of them fall within the mask area, indicating that the receiver would likely receive the signals properly.

Techniques described herein may be implemented in any suitable device to transmit any suitable data at any suitable rate. Some embodiments may be used in high-rate transmitters that may require quick settling times for oscillations and noise to enable the high rate of transmission. For example, some gigabit-rate transmitters, including gigabit Ethernet transmitters and gigabit High-Definition Multimedia Interface (HDMI) to transmitters, may incorporate and operate according to techniques described herein. Further, embodiments may be incorporated into devices where small size is a benefit or requirement, as some embodiments may have a size 25 percent less than conventional transmitters like the transmitter shown in FIG. 1.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A circuit to generate a signal, the circuit comprising:
   an input to receive data, the data comprising a sequence of bits;
   a first data path coupled to the input, the first data path comprising at least one first driver operating at a first switching frequency to generate a first signal from a first portion of the sequence of bits and not from a second portion of the sequence of bits; and
   a second data path coupled to the input, the second data path comprising at least one second driver operating at a second switching frequency to generate a second signal from the second portion of the sequence of bits and not the first portion of the sequence of bits.

2. The circuit of claim 1, wherein an overall switching frequency of the circuit, based at least on the first switching frequency and the second switching frequency, is at or above a bit rate of the circuit.

3. The circuit of claim 1, wherein the first switching frequency and the second switching frequency are a same frequency.

4. The circuit of claim 3, wherein the first switching frequency is at a different phase than the second switching frequency.

5. The circuit of claim 1, wherein the first portion and the second portion are non-overlapping portions.

6. The circuit of claim 5, wherein the first portion comprises a first half of the bits of the sequence of bits and the second portion comprises a second half of the bits of the sequence of bits.

7. The circuit of claim 1, further comprising:
   an output driver outputting a signal to be transmitted in a transmission medium and accepting input from the first data path and from the second data path.

8. The circuit of claim 1, wherein the first data path further comprises a first gate that turns the first data path on and off and the second data path further comprises a second gate that turns the second data path on and off, and
   wherein the first gate turns the first data path off when the second data path is generating the second signal and the second gate turns the second data path off when the first data path is generating the first signal.

9. The circuit of claim 8, wherein the circuit operates according to a clock frequency, and
   wherein the first gate operates according to a first half-rate clock frequency that has a frequency that is half of the clock frequency and the second gate operates according to a second half-rate clock frequency that has a frequency that is half of the clock frequency, the first half-rate clock frequency and the second half-rate clock frequency being oppositely phased.

10. The circuit of claim 9, wherein the first data path further comprises a first memory element accepting bits received at the input and the second data path further comprises a second memory element accepting bits received at the input,
    wherein the first memory element accepts bits according to the second half-rate clock frequency and the second memory element accepts bits according to the first half-rate clock frequency.

11. The circuit of claim 1, further comprising an output driver, the output driver comprising a first switch coupled to an output of the first data path and a second switch coupled to an output of the second data path.

12. The circuit of claim 11, wherein:
    the at least one first driver of the first data path comprises a first chain of one or more drivers and a second chain of one or more drivers, the first chain generating a first positive signal and the second chain generating a first negative signal,
    the at least one second driver of the second data path comprises a third chain of one or more drivers and a fourth chain of one or more drivers, the third chain generating a second positive signal and the fourth chain generating a second negative signal,
    the output driver further comprises third switch and a fourth switch, and
    the first switch is coupled to an output of the first chain, the second switch is coupled to an output of the second chain, the third switch is coupled to an output of the third chain, and the fourth switch is coupled to an output of the fourth chain.

13. The circuit of claim 1, wherein the first data path further comprises a first memory element accepting bits received at the input and the second data path further comprises a second memory element accepting bits received at the input, and
    wherein the first memory element is adapted to accept only bits in the first portion and the second memory element is adapted to accept only bits in the second portion.

14. The circuit of claim 1, wherein the at least one first driver of the first data path comprises a first chain of one or more drivers and a second chain of one or more drivers, the first chain generating a first positive signal and the second chain generating a first negative signal, and
    wherein the at least one second driver of the second data path comprises a third chain of one or more drivers and a fourth chain of one or more drivers, the third chain generating a second positive signal and the fourth chain generating a second negative signal.

15. The circuit of claim 1, further comprising:
    a third data path coupled to the input, the third data path comprising at least one third driver operating at a third switching frequency to generate a third signal from a third portion of the sequence of bits, the first portion, the second portion, and the third portion being non-overlapping portions of the sequence of bits,
    wherein the overall switching frequency of the circuit, based at least on the first switching frequency, the second switching frequency, and the third switching frequency, is at or above the bit rate of the circuit.

16. The circuit of claim 1, wherein the circuit generates the signal having a bit rate of at least a gigabit per second.

17. A method of operating a circuit to generate a signal, the circuit including at least a first data path and a second data path, each of the first data path and the second data path including at least one driver switching to generate signals to be used in generating the signal, the method comprising:

allocating each bit of a sequence of bits to one of at least two subsets of bits, the at least two subsets of bits being non-overlapping subsets;

generating the signal by:

passing a first subset of bits and not a second subset of bits through the first data path and passing the second subset of bits and not the first subset of bits through the second data path, and operating the at least one driver of the first data path and the second data path such that an overall switching frequency of both the first data path and the second data path is at or above a bit rate of the circuit.

18. The method of claim 17, wherein operating the at least one driver of the first data path and the second data path comprising operating at least one first driver of the first data path to switch when at least one second driver of the second data path is not switching.

19. The method of claim 17, wherein operating the at least one driver of the first data path and the second data path comprises, for each bit:

when the bit is in the first subset:

turning on the first data path and turning off the second data path, and operating at least one first driver of the first data path to switch; and when the bit is in the second subset:

turning on the second data path and turning off the first data path, and operating at least one second driver of the second data path to switch.

20. The method of claim 19, wherein turning on the first data path comprises operating a first gate of the first data path to permit signals to flow to the at least one first driver and turning on the second data path comprises operating a second gate of the second data path to permit signals to flow to the at least one second driver.

21. The method of claim 20, wherein the circuit operates according to a clock frequency, and wherein operating the first gate comprises operating the first gate according to a first half-rate clock frequency that has a frequency that is half of the clock frequency and operating the second gate comprises operating the second gate according to a second half-rate clock frequency that has a frequency that is half of the clock frequency, the first half-rate clock frequency and the second half-rate clock frequency being oppositely phased.

22. The method of claim 17, wherein the first data path comprises a first memory element and the second data path comprises a second memory element, and wherein allocating each bit of the sequence of bits comprises operating the first memory element to accept bits according to a first half-rate clock frequency that has a frequency that is half of the clock frequency and operating the second gate comprises operating the second memory element according to a second half-rate clock frequency that has a frequency that is half of the clock frequency, the first half-rate clock frequency and the second half-rate clock frequency being oppositely phased, such that the first memory element and the second memory element accept different subsets of the sequence of bits.

23. The method of claim 17, wherein generating the signal comprises generating the signal with a bit rate of at least a gigabit per second.

* * * * *

UNITED STATES PATENT AND TRADEMARK OFFICE
CERTIFICATE OF CORRECTION

PATENT NO. : 8,314,633 B2  
APPLICATION NO. : 12/650092  
DATED : November 20, 2012  
INVENTOR(S) : Nitin Gupta et al.

Page 1 of 1

It is certified that error appears in the above-identified patent and that said Letters Patent is hereby corrected as shown below:

Title page, item (73) Assignee should read as follows: STMicroelectronics International N.V. Amsterdam, (NL)

Col. 1, line 6, should read:
visional patent application number 1885/Del/2009, filed on Col. 3, line 66, should read:
the at least two subsets of bits are non-overlapping subsets, Col. 4, line 37, should read:
even and odd driver, such that the odd driver receives every Col. 5, line 64, should read:
HalfClock signal, HalfClockBar is a half-rate form of the Col. 7, line 21, should read:
cases, the switching frequency may be implemented as a Col. 8, line 2, should read:
even data path is turned off, the data bit is sent through the Col. 8, line 48, should read:
face (HDMI) transmitters, may incorporate and operate Signed and Sealed this  
Twelfth Day of February, 2013

Teresa Stanek Rea  
*Acting Director of the United States Patent and Trademark Office*